United States Patent
Koops et al.

(10) Patent No.: US 7,361,555 B2
(45) Date of Patent: Apr. 22, 2008

(54) TRENCH-GATE TRANSISTORS AND THEIR MANUFACTURE

(75) Inventors: Gerrit E. J. Koops, Kessel-Lo (BE); Michael A. A. In 'T Zandt, Veldhoven (NL)

(73) Assignee: NXP B.V., Eindhoven (NL)

( * ) Notice: Subject to any disclaimer, the term of this patent is extended or adjusted under 35 U.S.C. 154(b) by 7 days.

(21) Appl. No.: 10/591,352

(22) PCT Filed: Feb. 28, 2005

(86) PCT No.: PCT/IB2005/050723

§ 371 (c)(1),
(2), (4) Date: Aug. 31, 2006

(87) PCT Pub. No.: WO2005/088725

PCT Pub. Date: Sep. 22, 2005

(65) Prior Publication Data

US 2007/0181975 A1   Aug. 9, 2007

(30) Foreign Application Priority Data

Mar. 10, 2004   (GB) ............................... 0405325.2

(51) Int. Cl.
*H01L 21/336* (2006.01)
(52) U.S. Cl. .................. 438/268; 257/E21.411; 257/E21.679; 257/E21.163; 257/E21.054; 257/E21.063
(58) Field of Classification Search ............... 438/268; 257/E21.679, E21.163, E21.054, E21.063, 257/E21.411
See application file for complete search history.

(56) References Cited

U.S. PATENT DOCUMENTS 5,304,622 A * 4/1994 Ikai et al. .................. 528/16

(Continued)

FOREIGN PATENT DOCUMENTS

WO   WO 01/09956   2/2001

OTHER PUBLICATIONS

Lin M-J et al: "Characterizing Trench-Gate Power Metal-Oxide-Semiconductor Field Effect Transistor With Multi-Layer Dielectrics at the Trench Bottom"; Japanese Journal of Applied Physics, Part 1; vol. 42 No. 11; Nov. 2003; Tokoyo JP pp. 6795-6799.

*Primary Examiner*—Michael Lebentritt
*Assistant Examiner*—Thu-Huong Dinh

(57) ABSTRACT

A trench-gate transistor has an integral first layer of silicon dioxide extending from the upper surface of the semiconductor body over top corners of each cell array trench. The integral first layer also provides a thin gate dielectric insulating layer for a thick gate electrode and the integral first layer also provides a first part of a stack of materials which constitute a thick trench sidewall insulating layer for a thin field plate. Consistent with an example embodiment, there is a method of manufacture. A hardmask used to etch the trenches is removed before providing the silicon dioxide layer. The layer is then protected by successive selective etching of the oxide layer and the nitride layer in the upper parts of the trenches. After the gate electrodes are provided, layers for the channel accommodating regions and source regions may be formed through the oxide layer on the upper surface.

4 Claims, 2 Drawing Sheets

Figure 1:
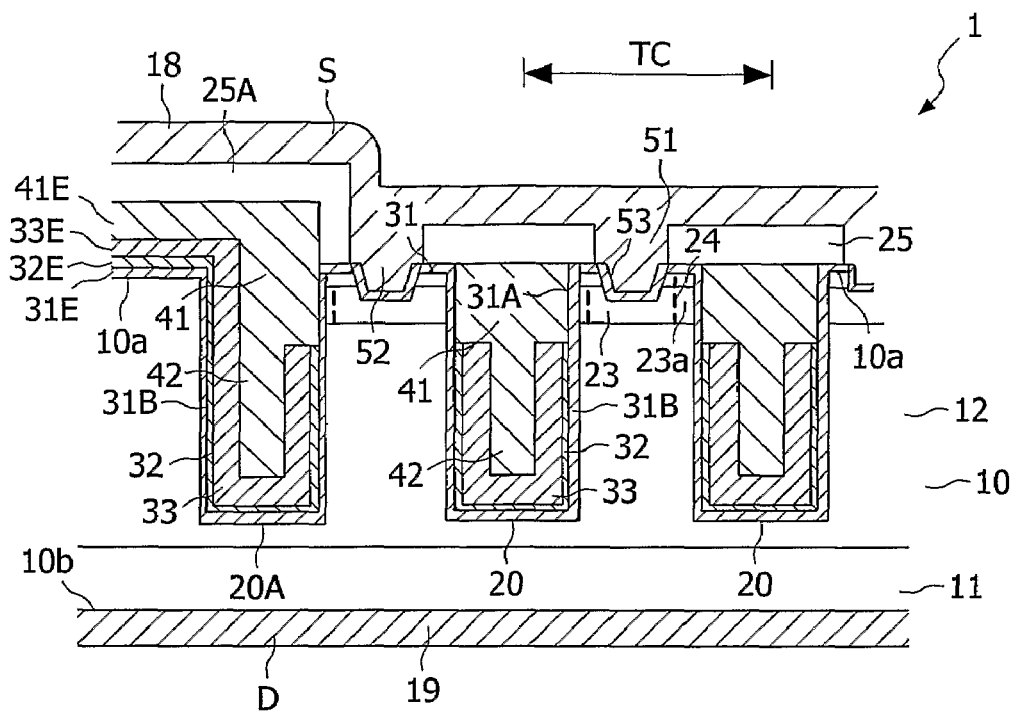

U.S. PATENT DOCUMENTS 5,567,634 A * 10/1996 Hebert et al. ................ 438/270
5,637,898 A 6/1997 Baliga
6,211,018 B1 * 4/2001 Nam et al. .................. 438/270
6,392,257 B1 * 5/2002 Ramdani et al. ............ 257/190
6,528,355 B2 * 3/2003 Hirler et al. ................ 438/135
7,309,664 B1 * 12/2007 Marzolin et al. ............. 442/97

* cited by examiner

TRENCH-GATE TRANSISTORS AND THEIR MANUFACTURE

This invention relates to trench-gate transistors and their manufacture.

In particular this invention relates to a cellular trench-gate transistor comprising a silicon semiconductor body having an array of transistor cells, the cells being bounded by a pattern of trenches lined with insulating material within the array, the array trenches extending from an upper surface of the semiconductor body through a channel accommodating body region into an underlying drain drift region, the insulating material in each array trench providing a thin gate dielectric insulating layer on a trench sidewall adjacent the channel accommodating body region and a thick insulating layer on a trench sidewall adjacent the drain drift region, conductive material in each array trench providing a gate electrode on the thin trench sidewall insulating layer and a field plate on the thick trench sidewall insulating layer.

In the transistor as defined above, the field plate on the thick trench sidewall insulating layer rearranges the electrical field profile in the drain drift region in such a way that it becomes more uniform and will give a substantially linear potential profile. In this way the source-drain reverse breakdown voltage of the transistor is significantly increased by the RESURF effect, compared with a conventional trench-gate transistor having the same thickness of the drain drift region and doping levels but not having the field plates in the array trenches.

A transistor as defined above is known from U.S. Pat. No. 5,637,898. In the structure of the transistor disclosed in this U.S. Patent both the thin trench sidewall insulating layer and the thick trench sidewall insulating layer are silicon dioxide. The gate electrode conductive material in each array trench is polysilicon which is oxidised to form an upper insulating layer level with a source region at the upper surface of the semiconductor body, and source metal extends over the top corner of each array trench on and level with this upper surface. In a method of manufacture of the transistor disclosed in this U.S. Patent, regions for providing the channel accommodating body regions and source regions are first formed in an epitaxial drain drift region, then the array trenches are etched using an oxide-nitride hardmask, then the thick trench sidewall insulating layer and the thin field plate are formed with the hardmask still present, then the thin trench sidewall insulating layer and the thick gate electrode and then the upper insulating layer over the gate electrode are formed with the hardmask still present, and then the hardmask is removed. During this process the oxide of the oxide-nitride hardmask may be undesirably etched, which can, inter alia, attack the thin trench sidewall insulating layer near the top corners of the trenches.

According to a first aspect of the present invention, there is provided a cellular trench-gate transistor comprising a silicon semiconductor body having an array of transistor cells, the cells being bounded by a pattern of trenches lined with insulating material within the array, the array trenches extending from an upper surface of the semiconductor body through a channel accommodating body region into an underlying drain drift region, the insulating material in each array trench providing a thin gate dielectric insulating layer on a trench sidewall adjacent the channel accommodating body region and a thick insulating layer on a trench sidewall adjacent the drain drift region, conductive material in each array trench providing a gate electrode on the thin trench sidewall insulating layer and a field plate on the thick trench sidewall insulating layer, wherein an integral first layer of silicon dioxide extends from the upper surface of the semiconductor body over top corners of each array trench, the integral first layer also providing the thin gate dielectric insulating layer and the integral first layer also providing a first part of a stack of materials which constitute the thick trench sidewall insulating layer, a layer of silicon nitride providing a second part of the stack, and a second layer of silicon dioxide providing a third part of the stack.

An advantage of the transistor structure defined above in accordance with the invention is that the integrity of the first layer of silicon dioxide where it extends over the top corners of the trench helps to avoid gate-source short-circuits in operation of the transistor.

The transistor structure in accordance with the invention advantageously may have a simple edge termination. That is, an edge termination for the transistor may include a perimeter trench around the array of transistor cells, wherein the stack of materials which constitutes the thick trench sidewall insulating layer in the array trenches extends around a top corner of the perimeter trench and on to the upper surface of the semiconductor body, and wherein conductive material on the stack in the perimeter trench extends around the top corner of the perimeter trench to provide an edge field plate for the transistor.

According to a second aspect of the present invention, there is provided a method of manufacturing a cellular trench-gate transistor comprising a silicon semiconductor body having an array of transistor cells, the cells being bounded by a pattern of trenches lined with insulating material within the array, the array trenches extending from an upper surface of the semiconductor body through a channel accommodating body region into an underlying drain drift region, the insulating material in each array trench providing a thin gate dielectric insulating layer on a trench sidewall adjacent the channel accommodating body region and a thick insulating layer on a trench sidewall adjacent the drain drift region, conductive material in each array trench providing a gate electrode on the thin trench sidewall insulating layer and a field plate on the thick trench sidewall insulating layer, the method being characterised by including the steps of:

(a) providing a hardmask on the upper surface of the semiconductor body, then forming the array trenches by etching using the hardmask, and then removing the hardmask;

(b) providing an integral first layer of silicon dioxide which extends on the upper surface of the semiconductor body, over the top corners of the array trenches, and over the sidewalls and the base of each of the array trenches, the first layer of silicon dioxide providing the thin gate dielectric insulating layer in the manufactured transistor;

(c) providing a layer of silicon nitride over the first layer of silicon dioxide and then providing a second layer of silicon dioxide over the silicon nitride layer;

(d) providing conductive material in each array trench to form the thin field plate;

(e) selectively etching the second silicon dioxide layer and then the silicon nitride layer above the thin field plates such that the thick trench sidewall insulating layer is constituted by a stack of the first silicon dioxide layer, the silicon nitride layer and the second silicon dioxide layer;

(f) providing conductive material in each array trench to form the thick gate electrode.

The method defined above in accordance with the present invention involving removal of the hardmask in step (a) before providing the first layer of silicon dioxide in step (b), and then providing the silicon nitride layer in step (c) has advantages including the following. The topography of first layer of silicon dioxide over the top corners of the array trenches for the manufactured transistor is established immediately after removal of the hardmask and is retained thereafter. The silicon nitride layer protects the integrity of the first layer of silicon dioxide during steps (d) and (e). In particular the integrity of this layer is protected where it forms the thin gate dielectric insulating layer in the manufactured transistor and also where it extends over the top corners of the trench, which helps to avoid gate-source short-circuits in operation of the manufactured transistor.

Because the hardmask used in the above method is removed in step (a) immediately after its use for etching the trenches, this hardmask does not need to be a multiple layer stack, e.g. nitride-oxide, and can advantageously be a single silicon dioxide layer.

The method of the present invention may include the further step of:

(g) forming layers for the channel accommodating body region and source regions for the transistor cells through the first layer of silicon dioxide on the upper surface of the semiconductor body.

The same steps as are used to provide the array trench-gate structures in the method of the present invention may be advantageously used also to provide an edge termination for the transistor. Thus steps for forming an edge termination for the transistor may include:

(h) forming a perimeter trench around the array of transistor cells during step (a) and using the same hardmask;

(i) providing the first layer of silicon dioxide, the layer of silicon nitride and the second layer of silicon dioxide around a top corner of the perimeter trench and on the upper surface at the edge of the semiconductor body during steps (b) and (c);

(j) providing conductive material in the perimeter trench by means of step (d);

(k) allowing the stack of the first silicon dioxide layer, the silicon nitride layer and the second silicon dioxide layer to remain around a top corner of the perimeter trench and on the upper surface at the edge of the semiconductor body during the selective etching of step (e); and (l) providing conductive material on the stack around the top corner of the perimeter trench to provide an edge field plate for the transistor at the same time as forming the thick gate electrode in the array trenches during step (f).

In a transistor as defined in accordance with the first aspect of the invention, or in a transistor manufactured by the method as defined in accordance with the second aspect of the invention, the drain drift region may advantageously be more highly doped near the base of the array trenches than near the channel accommodating body region. For example, the drain drift region can have a linear doping profile. In this way the on-resistance of the transistor may be reduced while retaining an increased reverse breakdown voltage due to the RESURF effect of the thin field plates in the array trenches. This advantageous combination of features is known per se, for example from the above-mentioned U.S. Pat. No. 5,637,898.

An example of a cellular trench-gate field-effect transistor in accordance with the present invention, and an example of a method of manufacturing such a transistor in accordance with the present invention, will now be described in detail with reference to the accompanying drawings, in which:

FIG. 1 shows a schematic cross-section view of a cellular trench-gate field-effect transistor, including two cell array trenches and an edge termination perimeter trench; and FIGS. 2A to 2F show steps in a method of manufacturing the transistor shown in FIG. 1.

Referring now to FIG. 1, there is shown a schematic cross-section view of a cellular trench-gate field-effect transistor in the form of a vertical MOSFET device 1 suitable for a power transistor. The device 1 comprises a silicon semiconductor body 10 having an array of transistor cells, the cells being bounded by a pattern of array trenches 20 within the array. The array trenches 20 extend vertically from an upper surface 10a of the semiconductor body 10 through a p type channel accommodating body region 23 within each cell into an underlying n type drain drift region 12 common to the cells. An n+ source region 24 is present in each transistor cell under the upper surface 10a adjacent a surrounding array trench 20. FIG. 1 shows two cross-sections of an array trench 20 bounding a transistor cell having a lateral extent (cell pitch) TC. An n+ drain region 11 underlies the drain drift region 12 and is common to the cells.

The array trenches 20 are lined with insulating material which provides a thin gate dielectric insulating layer 31A on a trench sidewall adjacent the channel accommodating body region 23 and a thick insulating layer 31B, 32, 33 on a trench sidewall adjacent the drain drift region 12. Doped polycrystalline silicon conductive material in each array trench 20 provides a thick gate electrode 41 on the thin trench sidewall insulating layer 31A and a thin field plate 42 on the thick trench sidewall insulating layer 31B, 32, 33. As is shown in FIG. 1, the thick gate electrode 41 and the thin trench sidewall insulating layer 31A may extend a short way into the drain drift region 12.

In the device 1, an integral first layer 31 of silicon dioxide extends from the upper surface 10a of the semiconductor body 10 over the top corners of each trench 20. This integral layer 31 of silicon dioxide also provides the thin gate dielectric insulating layer 31A, and also provides a first part 31B of the thick trench sidewall insulating layer having a stack of materials 31B, 32, 33. A layer 32 of silicon nitride provides a second part of the stack. A layer 33 of silicon dioxide provides a third part of the stack.

Thus, for each transistor cell, the source region 24 and the drain drift region 12 are vertically separated by the channel accommodating body region 23 adjacent a surrounding trench-gate provided by the gate electrode 41 on the gate dielectric insulating layer 31A. This enables a vertical conduction channel 23a to be formed in the body portion 23 adjacent the gate dielectric insulating layer 31A when a suitable gate potential is applied to the gate electrode 41 in the on-state of the device 1, whereby current flows in a path in each transistor cell from the source region 24 vertically through the conduction channel 23a to the drain drift region 12. The thin field plates 42 on the thick trench sidewall insulating layers 31B, 32, 33 arrange the electrical field profile in the drain drift region 12 by the RESURF effect to become substantially uniform in the off-state of the device 1 with a substantially linear potential profile whereby a high source-drain reverse breakdown voltage of the transistor is achieved.

FIG. 1 shows the layer 32 of silicon nitride to be thinner than the layer 33 of silicon dioxide. This can be advantageous, for example in reducing the total thickness of the stack 31B, 32, 33 required for the desired RESURF effect in higher voltage devices. However, in certain cases (especially in narrow-pitch devices for low voltages) it may be better to have the nitride layer 32 thicker than the oxide layer 33.

In the transistor device 1 as shown in FIG. 1, the drain drift region 12 may advantageously be more highly doped near the base of the array trenches 20 than near the channel accommodating body regions 23. For example, the drain drift region 12 can have a linear doping profile. In this way the on-resistance of the transistor may be reduced while retaining an increased reverse breakdown voltage due to the RESURF effect of the thin field plates 42 in the array trenches.

An insulating region 25 of silicon dioxide is provided over each of the gate electrodes 41. Source metallisation 18 contacting all of the source regions 24 and body regions 23 is provided on the upper surface 10a over the insulating regions 25 to provide a source electrode S. Electrical connection to the gate electrodes 41 is provided by extending the insulating layers 31, 32 and 33 on to the upper top surface 10a of the semiconductor body as layers 31E, 32E, 33E in an area outside the transistor cell array and extending the gate electrode material 41 on to this top surface insulating layer as a plate 41E for contact by metallisation to provide a device electrode for the gate electrodes. A metallisation layer 19 forms an ohmic contact with the drain region 11 so as to provide a drain electrode D.

The cross-section view shown in FIG. 1 applies equally to various cell geometries which are known for trench-gate devices. There may be an open-cell geometry having a one-dimensionally repetitive pattern in which the trench-gates are parallel stripes which each extend across the cell array area of the device at the peripheries of open stripe-shaped transistor cells TC. Otherwise, there may be a closed-cell geometry having a two-dimensionally repetitive pattern in which the trench-gates over the cell array area of the device surround closed polygonal transistor cells TC. The closed cells may commonly be square shaped, hexagonal shaped or stripe shaped.

In the transistor shown in FIG. 1, the insulating lining provided by the layers 31 (with 31A and 31B), 32 and 33 has an advantage in that the integrity of the first layer of silicon dioxide 31 where it extends over the top corners of each array trench 20 helps to avoid short circuits between the gate electrodes 41 and the source regions 24 in operation of the transistor.

In addition to the cell array trenches 20, FIG. 1 shows a perimeter trench 20A around the array of transistor cells and included in an example of a simple edge termination for the transistor device 1. The stack of materials, silicon dioxide 31B-silicon nitride 32-silicon dioxide 33, which constitutes the thick trench sidewall insulating layer in the array trenches 20 extends around a top corner of the perimeter trench 20A and on the upper surface 10a of the semiconductor body 10 as an upper surface insulating layer 31E, 32E, 33E. In particular, the top layer 33E is an extension of the thicker second silicon dioxide layer 33. Doped polycrystalline silicon conductive material 41, 42 on the stack 31B, 32, 33 in the perimeter trench 20A extends around the top corner of the perimeter trench 20A to provide an edge field plate 41E for the transistor. As indicated above, the field plate 41E can also be used to provide connection to the gate electrode for the device.

A method of manufacturing the transistor 1 shown in FIG. 1 will now be described with reference to FIGS. 2A to 2F.

Figures 2A, 2B:
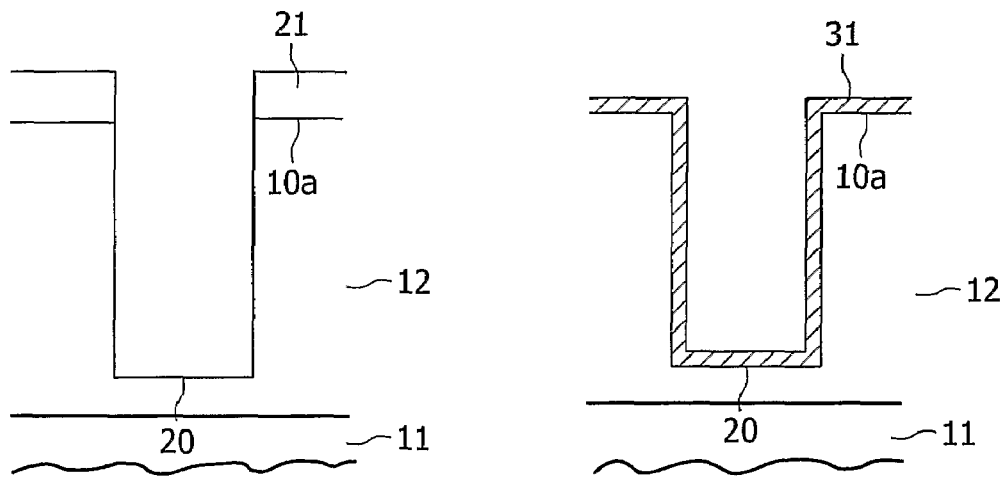

Referring now to FIG. 2A, drain drift n-type material 12 is epitaxially grown on a substrate of n+ type material for the drain region 11. The drain drift material 12 extends to the intended upper surface 10a of the semiconductor body. A hardmask 21 consisting of a single layer of silicon dioxide is provided on the drain drift material 12, and the array trenches 20 are formed by etching using the hardmask. The perimeter trench 20A shown in FIG. 1 is formed at the same time as the trenches 20 using the same hardmask 21. The hardmask 21 is then removed.

Referring now to FIG. 2B, an integral first layer 31 of silicon dioxide is provided, for example by oxidation growth. The silicon dioxide layer 31 extends on the upper surface 10a of the semiconductor body, over the top corners of the array trenches 20, and over the sidewalls and the base of each of the array trenches 20. The silicon dioxide layer 31 will provide the thin gate dielectric insulating layer 31A in the manufactured transistor as shown in FIG. 1.

Figure 2C:
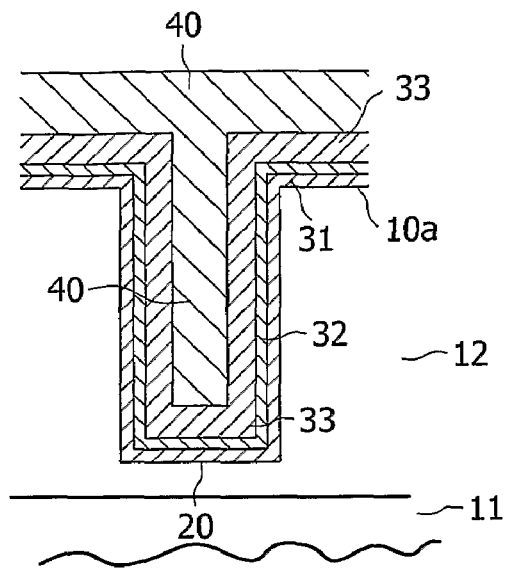

Referring now to FIG. 2C, a layer 32 of silicon nitride is provided by deposition over the first layer 31 of silicon dioxide. Then a second layer 33 of silicon dioxide is provided by deposition over the silicon nitride layer 32.

During the steps just described with reference to FIGS. 2B and 2C, the first layer 31 of silicon dioxide, the layer 32 of silicon nitride and the second layer 33 of silicon dioxide are provided around a top corner of the perimeter trench 20A and on the upper surface 10a at the edge of the semiconductor body to form the upper surface insulating layer 31E, 32E, 33E as shown in FIG. 1.

Referring again to FIG. 2C, doped polycrystalline silicon 40 is deposited to fill the array trenches 20 and the perimeter trench 20A and to extend to a level above the second silicon dioxide layer 33 on the upper surface 10a.

Figure 2D:
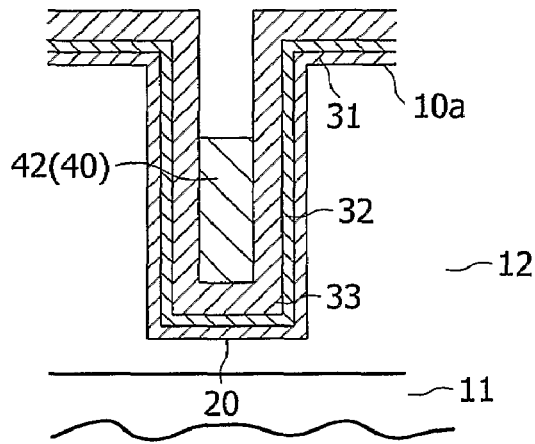

Referring now to FIG. 2D, the polycrystalline silicon 40 is first etched back to the upper surface of the silicon dioxide layer 33, and then it is over-etched in the trenches 20 and 20A down to a level at the bottom of or a little below where the p-type channel accommodating region 23 will be present in the manufactured transistor as shown in FIG. 1. The polycrystalline silicon 40 thus provides conductive material in each array trench 20 to form the thin field plate 42 as shown in FIG. 1.

Figure 2E:
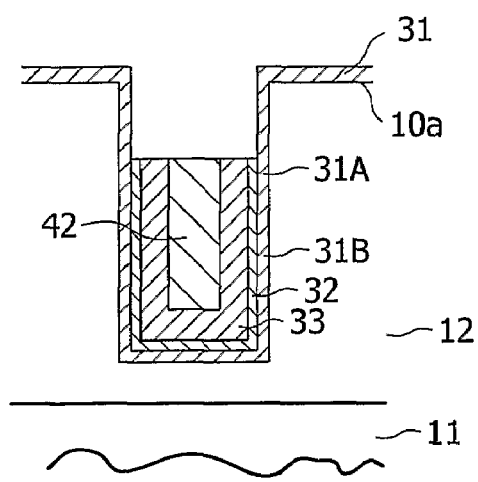

Referring now to FIG. 2E, the second silicon dioxide layer 33 is etched where it is exposed above the thin field plate 42 by a wet etch which is selective with respect to the silicon nitride layer 32. During this etch the silicon nitride layer 32 protects the integrity of the first silicon dioxide layer 31 where it will form the thin gate dielectric insulating layer 31A as shown in FIG. 1. Also, and in particular, the integrity of the silicon dioxide layer 31 is protected where it extends over the top corners of the array trenches, which will help to avoid short-circuits in operation of the manufactured transistor as shown in FIG. 1 between the gate electrodes 41 and the source regions 24. The silicon nitride layer 32 is then etched where it is exposed above the thin field plate 42 by a wet etch which is selective with respect to the silicon dioxide layer 31. At this stage there is provided in each array trench 20 the thin field plate 42 on the thick trench sidewall insulating layer which has the stack of the first silicon dioxide layer 31B, the silicon nitride layer 32 and the second silicon dioxide layer 33.

During the selective etching steps described above with reference to FIG. 2E the stack of the first silicon dioxide layer 31, the silicon nitride layer 32 and the second silicon dioxide layer 33 is allowed to remain around a top corner of the perimeter trench 20A and on the upper surface 1Oa at the edge of the semiconductor body to form the upper surface insulating layer 31E, 32E, 33E as shown in FIG. 1.

Figure 2F:
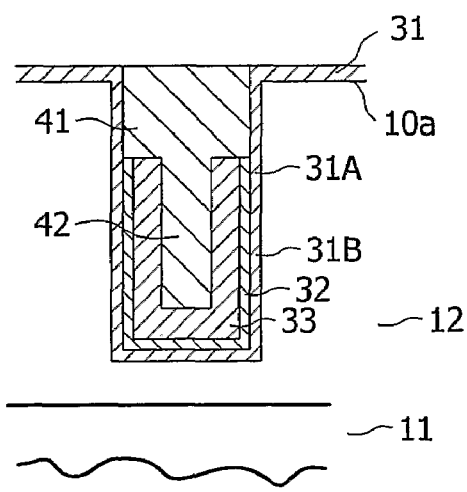

Referring now to FIG. 2F, doped polycrystalline silicon is then deposited to fill the array trenches 20 and the perimeter trench 20A and to extend to a level above the first silicon dioxide layer 31 at the upper surface between the trenches 20 and above the second silicon dioxide layer 33E adjacent the perimeter trench 20A (as shown in FIG. 1). This polycrystalline silicon is then etched back in the transistor cell array area to the upper surface of the first silicon dioxide layer 31, thus providing conductive material in each array trench 20 to form the thick gate electrode 41. During this etch back, as shown in FIG. 1, this polycrystalline silicon is allowed to remain on top of the perimeter trench 20A and on top of the second silicon dioxide layer 33E adjacent the trench 20A so as to provide conductive material for an edge field plate 41E for the transistor.

The first layer of silicon dioxide 31 on the upper surface 10a between the array trenches 20 is preferably then used directly as a screening oxide through which layers for the channel accommodating body regions 23 and the source regions 24, as shown in FIG. 1, are successively formed by implantation and diffusion.

The annular shape of the source regions 24 as shown in FIG. 1 is not defined at the implantation stage described just above, but rather n+ type material is formed as a continuous layer in the areas bounded by the array trenches 20. After this, an upper thick insulating layer of silicon dioxide is provided over the silicon dioxide layer 31 on the top of the cell array area and over the polysilicon edge field plate 41E. Contact holes 51 are etched through this upper insulating layer leaving the insulating layers 25 over the gate electrodes 41 and an insulating layer 25A over the edge field plate 41E. The holes 51 are then used to etch moat shaped holes 52 which define the lateral size of the source regions 24 and extend into the channel accommodating regions 23. Moat shaped layers 53 are provided by an extra (p-type) implant to form a good ohmic contact between the source regions 24 and the channel accommodating regions 23. The oxide layers 25, 25A are then reduced to pull them back from the moat shaped layers 53, and the source metallisation 18 is provided which contacts the source regions 24 and the channel accommodating regions 23 in the holes 52 via the layers 53.

From reading the present disclosure, other variations and modifications will be apparent to persons skilled in the art. Such variations and modifications may involve equivalent and other features which are already known in the art, and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new claims may be formulated to such features and/or combinations of such features during the prosecution of the present Application or of any further Application derived therefrom.

The invention claimed is:

1. A method of manufacturing a cellular trench-gate transistor comprising a silicon semiconductor body having an array of transistor cells (TC), the cells being bounded by a pattern of array trenches lined with insulating material within the array, the array trenches extending from an upper surface of the semiconductor body through a channel accommodating body region into an underlying drain drift region, the insulating material in each array trench providing a thin gate dielectric insulating layer on a trench sidewall adjacent the channel accommodating body region and a thick insulating layer on a trench sidewall adjacent the drain drift region, conductive material in each array trench providing a gate electrode on the thin trench sidewall insulating layer and a field plate on the thick trench sidewall insulating layer, wherein the method includes the steps of:

(a) providing a hardmask on the upper surface of the semiconductor body, then forming the array trenches by etching using the hardmask, and then. removing the hardmask;

(b) providing an integral first layer of silicon dioxide which extends on the upper surface of the semiconductor body, over the top corners of the array trenches, and over the sidewalls and the base of each of the array trenches, the first layer of silicon dioxide providing the thin gate dielectric insulating layer in the manufactured transistor;

(c) providing a layer of silicon nitride over the first layer of silicon dioxide and then providing a second layer of silicon dioxide over the silicon nitride layer;

(d) providing conductive material in each array trench to form the thin field plate;

(e) selectively etching the second silicon dioxide layer and then the silicon nitride layer above the thin field plates such that the thick trench sidewall insulating layer has a stack of the first silicon dioxide layer, the silicon nitride layer and the second silicon dioxide layer; and then (f) providing conductive material in each array trench to form the thick gate electrode.

2. The method as recited in claim 1, wherein the hardmask used in step (a) is a single silicon dioxide layer.

3. The method as recited in claim 1, including the further step of:

(g) forming layers for the channel accommodating body region and source regions for the transistor cells through the first layer of silicon dioxide on the upper surface of the semiconductor body.

4. The method as recited in claim 1, wherein steps for forming an edge termination for the transistor include:

(h) forming a perimeter trench around the array of transistor cells (TC) during step (a) and using the same hardmask;

(i) providing the first layer of silicon dioxide, the layer of silicon nitride and second layer of silicon dioxide around a top corner of the perimeter trench and on to the upper surface at the edge of the semiconductor body during steps (b) and (c);

(j) providing conductive material in the perimeter trench by means of step (d);

(k) allowing the stack of the first silicon dioxide layer, the silicon nitride layer and the second silicon dioxide layer to remain around a top corner of the perimeter trench and on the upper surface at the edge of the semiconductor body during the selective etching of step (e); and (l) providing conductive material on the stack around the top corner of the perimeter trench to provide an edge field plate for the transistor at the same time as forming the thick gate electrode in the array trenches during step (I).

* * * * *